United States Patent [19]

Kendall et al.

[11] Patent Number: 4,998,263
[45] Date of Patent: Mar. 5, 1991

[54] GENERATION OF TRIGGER SIGNALS

[75] Inventors: James P. Kendall, Dunfermline; Martin P. Murphy, South Queensferry; William R. MacIsaac, Edinburgh, all of United Kingdom

[73] Assignee: Hewlett-Packard Co., Palo Alto, Calif.

[21] Appl. No.: 164,045

[22] Filed: Mar. 4, 1988

[30] Foreign Application Priority Data

Mar. 5, 1987 [EP] European Pat. Off. ........ 87301917.8

[51] Int. Cl.$^5$ .......................... H04K 1/00; H04L 7/00
[52] U.S. Cl. .................................... 375/115; 364/717; 331/78
[58] Field of Search .................... 375/1, 115, 106, 114, 375/116, 113; 370/93, 107, 77; 331/78; 364/717; 371/46

[56] References Cited

U.S. PATENT DOCUMENTS

| 3,648,237 | 3/1972 | Frey, Jr. et al. | 375/115 |
| 3,740,478 | 6/1973 | Breant et al. | 370/107 |
| 3,854,011 | 12/1974 | Mallory et al. | 370/107 |
| 3,881,099 | 4/1975 | Ailett et al. | 364/717 |
| 4,161,041 | 7/1979 | Butler et al. | 375/115 |
| 4,242,755 | 12/1980 | Gauzen | 375/116 |
| 4,361,891 | 11/1982 | Lobenstein et al. | 375/107 |
| 4,590,601 | 5/1986 | Beeman | 364/717 |
| 4,639,548 | 1/1981 | Oshima et al. | 371/46 |
| 4,754,465 | 6/1988 | Trimble | 370/107 |
| 4,768,192 | 8/1988 | Pattavina et al. | 370/105.1 |

FOREIGN PATENT DOCUMENTS 2435057 10/1973 Fed. Rep. of Germany .

OTHER PUBLICATIONS

J. J. O'Reilly "Series-parallel Generation of M-Sequence" The Radio and Electronic Engineer, vol. 45, No. 4 pp. 171-176 4/1975.

Primary Examiner—Douglas W. Olms
Assistant Examiner—Stephen Chin
Attorney, Agent, or Firm—Karl E. Bring

[57] ABSTRACT

Apparatus for generating trigger signals for a serial stream of bits which has continuously repeating patterns and which has been formed by serializing a plurality of parallel streams, for example, a maximal length PRBS. The apparatus operates by identifying with which parallel stream cycle a trigger signal should occur and with which bit of the parallel stream in that cycle the trigger signal should be associated. Embodiments constructed in accordance with the invention can operate mainly at the clock rate of the parallel streams, that is, the lower clock rate.

9 Claims, 3 Drawing Sheets

GENERATION OF TRIGGER SIGNALS

BACKGROUND OF THE INVENTION

This invention relates to the generation of trigger signals for a serial stream of bits which has a continuously repeating pattern and which has been formed by serializing a plurality of parallel streams The invention has particular, but not exclusive, application to the generation of trigger signals for a class of serial streams known as maximal length Pseudo Random Binary Sequences' (hereinafter referred to as PRBS), which may be formed by serializing a plurality of parallel streams.

The bit rate of a serial stream formed as above is typically an order of magnitude higher than that of the parallel streams from which it is formed. Such serial 16 streams are used, for example, in the testing of high speed digital signal links. There is a need to provide a means of producing a trigger signal which is synchronized to the high rate serial stream and which occurs in the same position during each repeating pattern.

One way of producing such a trigger signal would be to sense a particular sequence of bits in the serial stream. This would require logic circuitry operating at the high (serial) rate, and would be complex.

An alternative is to try to sense a sequence of bits occurring in the parallel stream. This would not necessarily give one trigger signal for each repetition of the serial output pattern.

SUMMARY OF THE INVENTION

The present invention is concerned with a technique which will produce a trigger signal on every pattern cycle and which can be implemented with circuitry operating mainly at the lower (parallel) clock rate.

According to one aspect of the present invention there is provided apparatus for generating trigger signals for a serial stream of bits which has a continuously repeating pattern and which has been formed by serializing a plurality of parallel streams, said apparatus being characterized by comprising means for sensing within which parallel stream cycle a trigger signal should occur and means for sensing with which bit of the parallel stream in that cycle that trigger signal should be associated.

According to another aspect of the present invention there is provided a method for generating trigger signals for a serial stream of bits which has a continuously repeating pattern and which has been formed by serializing a plurality of parallel streams, the method being characterized by the steps of sensing within which parallel stream cycle a trigger signal should occur and sensing with which bit of the parallel stream in that cycle the trigger signal should be associated.

The method has application generally to the generation of trigger signals for use with parallel word generators whose outputs are serialized to form a bit stream at a higher rate.

DETAILED DESCRIPTION OF THE DRAWINGS

The invention will be described now by of example only with particular reference to the accompanying drawings. In the drawings.

DESCRIPTION OF A PREFERRED EMBODIMENT

The invention will be described in two stages. Firstly, the generation of trigger signals for the general case of a pattern of length P formed by serializing W parallel streams is briefly considered. Secondly, the more particular case of trigger signal generation for high rate PRBS sequences formed by serializing a plurality of parallel streams will be considered in detail.

When generating trigger signals for the general case of a pattern of length P formed by serializing W parallel streams, (P>W), sensing of the parallel stream cycles during which trigger signals should occur can be achieved by cycle counting, while trigger position within these cycles can be determined by an accumulator circuit. It is possible to express P as $$P = nW + X$$

n is an integer and X<W. Taking stream 0 in any parallel cycle as a reference trigger signal, then the next trigger signal should occur n parallel cycles later and be associated with stream X, that is, nW +X serial bits later as required. The stream with which each subsequent trigger signal should be associated is found by adding X to the stream number of the previous trigger signal. If the result (Y) is <W then count n cycles and generate a trigger signal associated with stream Y. If Y>W, then count n+1 cycles and generate a trigger signal associated with stream Y modulo W.

There is a special interest in high rate PRBS patterns formed by serializing a plurality of parallel PRBS's. PRBS signals are commonly used for testing digital signal links. Typically a PRBS is generated using a multi-stage shift register by combining selected outputs of the shift register by modulo 2 addition and feeding back the resulting signal as input to the first stage. The output of any stage of the shift register provides a maximal length PRBS provided the feedback connections are appropriately made (maximum length is $2^N - 1$ for an N stage register). For lower rate digital links a suitably fast PRBS can be achieved with a single shift register output.

For higher rate applications PRBS's may be generated using the series-parallel technique which can be found in the literature (e.g. 'Series-parallel generation of m-sequences' by J.J. O'Reilly, The Radio and Electronic Engineer, vol 45, no. 4, pp 171-176, April 1975). This document describes how to generate parallel streams which when serialized will form a PRBS.

Figure 1:
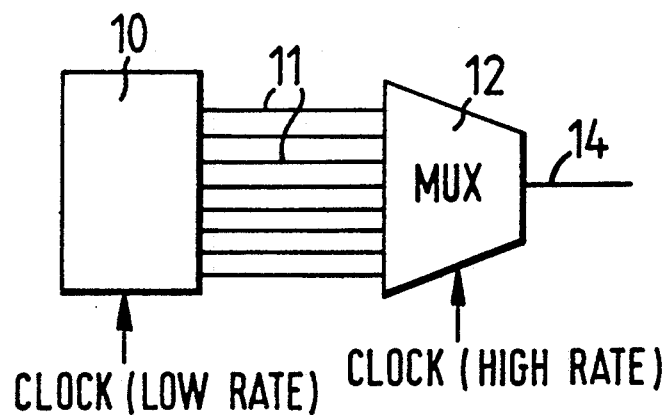
FIG. 1 is a block diagram illustrating the parallel to serial generation of a PRBS stream.

Referring to FIG. 1 there is shown in block diagram form an arrangement for producing a higher rate PRBS. The block 10 contains means for producing a plurality of streams on lines 11, such means being derived from the series-parallel technique described in the above mentioned document and operating at the lower rate. The streams on lines 11 are serialized by a multiplexer 12 to produce a higher rate PRBS on line 14. The number of parallel lines 11 is usually chosen to be a power of 2 to simplify implementation of the multiplexer 12 in binary logic circuits.

With such high rates PRBS's it is difficult to produce trigger signals. The trigger signal must be related to one particular bit in the serial output stream and must repeat itself at that bit for each successive repetition of the output PRBS, that is, at a spacing of $2^N - 1$ bits. One property of a $2^N - 1$ PRBS is that any sequence of N bits occurs only once during each pattern repetition. Therefore one way of producing a trigger signal would be to provide some means for detecting a sequence of N bits in the serial stream, and to generate the trigger signal on recognition of such sequence. Such means would have to operate at the high rate and would be complicated to construct. It is clearly preferable if the trigger signal can be generated with equipment operating mostly at the lower rate, and this is achieved with embodiments according to the present invention.

In these embodiments two pieces of information are identified; (i) the low rate clock cycle during which a trigger signal should occur; and (ii) the high rate bit within that cycle with which that trigger signal should be associated.

Figure 2:
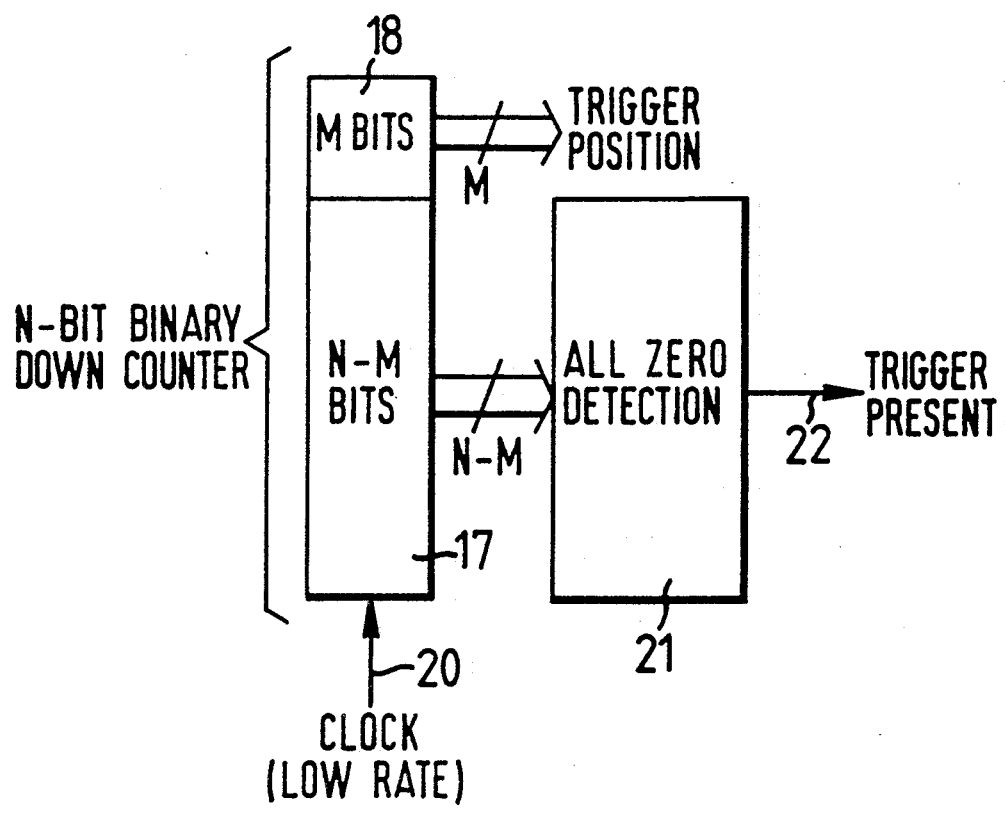
FIG. 2 is a block diagram illustrating a first embodiment in accordance with the present invention.

The first embodiment is shown in FIG. 2 of the drawings. It comprises an N stage binary counter, where $2^N - 1$ is the PRBS to be generated. If $2^m$ parallel streams are used to generate this PRBS, then the counter can be considered to consist of two sections. A first section 17 contains the N-m least significant bits, and a second section 18 consists of the m most significant bits.

The counter is clocked by a clock signal on line 20 at the low (parallel) rate, and is arranged to count downward with a cycle length of $2^N - 1$, that is, one count state (say the all 1's state) is skipped. Block 21 detects an all 0's condition in the lower N-m counter bits, and gives an output on line 22. These conditions occur every $2^{(N-m)} - 1$ clock cycles, except where the all 1's state is skipped when the spacing is $2^{(N-m)}$-clock cycles.

The upper m bits, section 18, considered alone will cycle through a count of $2^m - 1$ down to 0, with the change from 0 back to $2^m - 1$ occurring where the spacing between successive signals on line 22 is $2^{(N-m)} - 1$. Signals on line 22 may be used to indicate the clock cycles during which trigger signals should occur and the upper m bits used to determine the high rate bit with which that trigger signal should be associated. The spacing between trigger signals in the serial output is either:

$$2^{(N-m)} \times 2^m - 1 \quad \text{(1)}$$
cycles × bits/cycle − 1
(due to decreasing m bit count)

or $$[2^{(N-m)} - 1] \times 2^m + 2^m - 1 \quad \text{(ii)}$$
cycles × bits/cycle +
(due to increase in m bit count)

In either case the spacing is $2^N - 1$ series bits as required. It should be noted for this embodiment that the point in the output stream at which the trigger signal occurs can be defined by controlling the relationship between the starting point of the counter and the output stream.

A second embodiment for producing trigger signals is based on the proper decimation property of PRBS's, which is well known. This property dictates that if a maximal length PRBS is formed by serializing $2^m$ parallel streams, then each of the parallel streams must be a phase shifted version of the same PRBS. Each parallel PRBS is delayed by $2^{(N-m)}$ bits from its predecessor except for one which must be $2^{(N-m)} - 1$ delayed.

Figure 3:
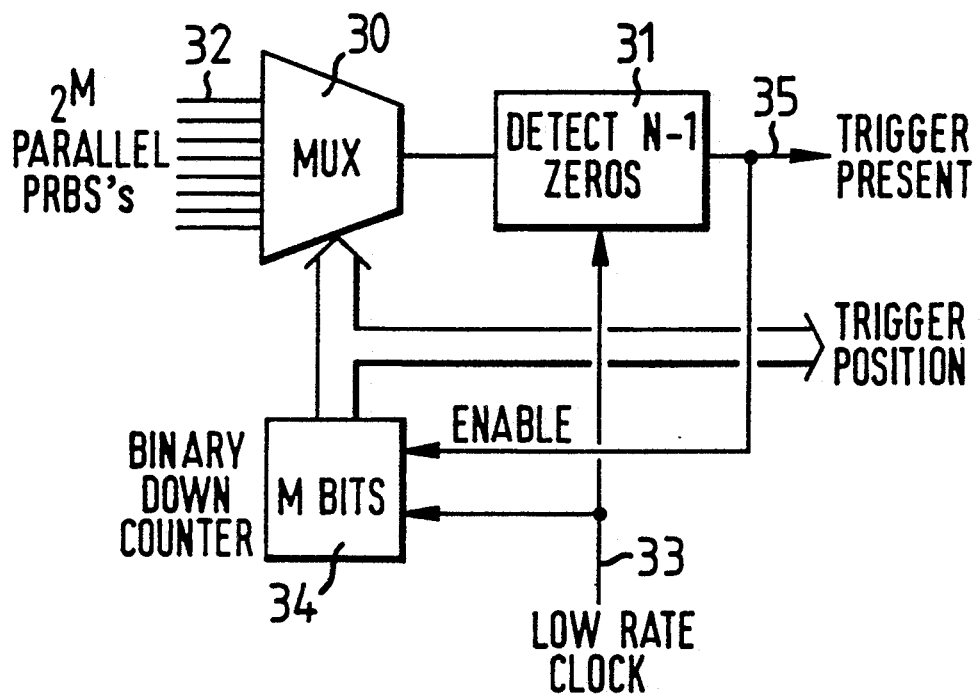
FIG. 3 is a block diagram illustrating a second embodiment in accordance with the present invention.

The embodiment operating on this principle is shown in FIG. 3 of the drawings. Block 30 is a $2^m$-to-1 multiplexer for selecting one of the parallel streams 32. The output of this multiplexer is sent to circuit 31 which detects a particular sequence of N bits (or N-1 zeros), and which operates at the low clock rate. An m-bit down counter 34 is used to control parallel stream selection in the multiplexer. This counter is enabled for one count when the output of the detection circuit on line 35 is active, thus selecting the next stream.

In operation output pulses are generally obtained from circuit 31 at intervals of $2^{(N-m)}$ low rate clock cycles, but one pulse in every $2^m$ is spaced by $2^{(N-m)}-1$ low rate cycles from its predecessor. Each such pulse identifies a low rate cycle in which a trigger signal should occur. The high rate bit within these cycles with which the trigger signal should be associated is defined by the m bits from counter 34.

For correct operation of this embodiment:
 (i) the parallel streams 32 must be selected in such sequence that any stream is delayed by $2^{(N-m)}$ [or $2^{(N-m)} - 1$]bits from the previous stream;
 (11) the stream selected by multiplexer address $2^m - 1$ must be the sequence that is delayed by $2^{(N-m)} - 1$ from its predecessor (selected by address 0).

The information generated by this embodiment is equivalent to that generated by the first embodiment shown in FIG. 2, and so trigger signals are produced every 2N-1 high rate bits.

The information produced by the circuits of Figures 2 and 3, (viz. the identifying of cycles, and positions within those cycles, when trigger signals should occur), can be used to generate a high rate trigger signal output using one of several possible schemes.

Figure 4:
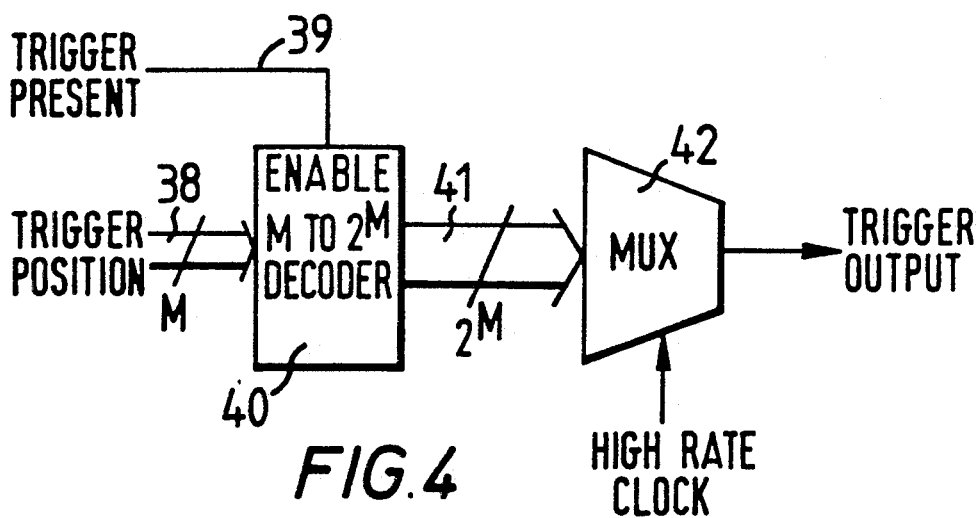
FIG. 4 shows one scheme for producing trigger signals from the information generated in the embodiments of FIGS. 2 or 3.

FIG. 4 of the drawings shows one such scheme. Block 40 is an m-to-$2^m$ decoder which is enabled by the 'trigger present' signal on line 39, and whose selection inputs are fed from the m 'trigger position' outputs from the previous embodiments.

This decoder operates at the low rate. When not enabled, all decoder outputs 41 are, for example, at logic 0. When enabled, one of the 2m outputs will be logic 1, that output being determined by said trigger position signals The outputs 41 are serialized by multiplexer 42 to form the high rate trigger signal. This multiplexer is identical to the multiplexer used to form the high rate data stream (FIG. 1) thus minimizing the circuit types required to operate at the high rate.

Figure 5:
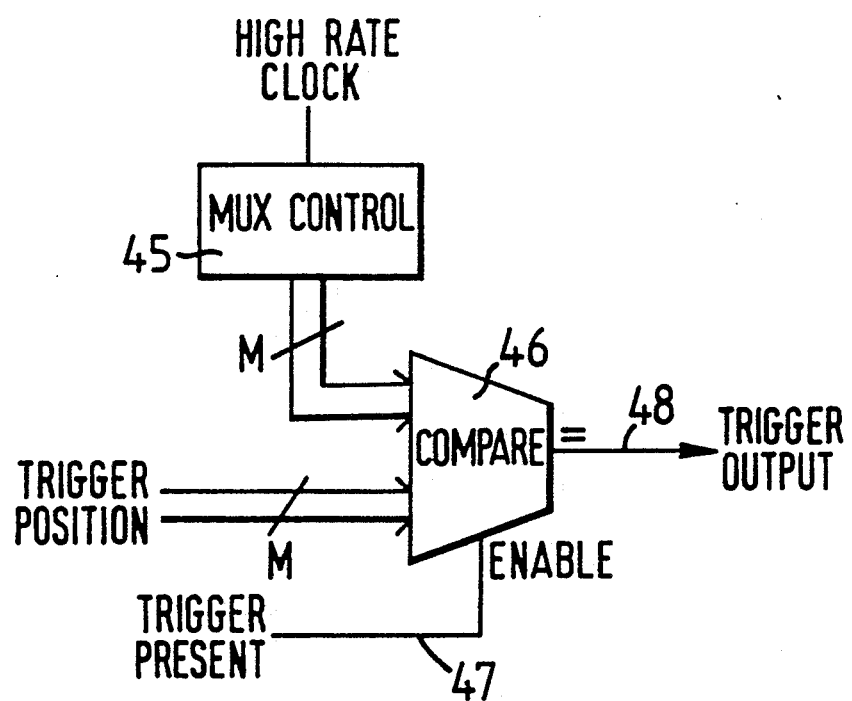
FIG. 5 shows an alternative scheme to that of FIG. 4.

An alternative scheme for generating the trigger signal is shown in FIG. 5 of the drawings. This scheme requires extra circuitry in the high speed data mux. Within a $2^m$-to-1 mux there exists circuitry shown at 45 which cycles through 2m states in order to control gating of $2^m$ inputs to a single output.

It is possible to arrange for comparison of these states with the trigger position signals to generate the correct high rate trigger output. This comparison can be carried out by the block shown schematically at 46 which is enabled only during those cycles when a trigger signal should occur, by the 'trigger present' signal on line 47. The required trigger signal appears on line 48.

We claim:
1. Apparatus for generating trigger signals for a serial stream of bits which has continuously repeating pat- terns and which has been formed by serializing a plurality of parallel streams, and where a parallel stream cycle is a set of one bit from each parallel stream, the bits occuring comtemporaneously, comprising:

means for sensing within which parallel stream cycle a trigger signal should occur, means for sensing with which bit of the parallel stream in that cycle the trigger signal should be associated;

means for counting having N stages where N is an integer, wherein the first (n-m) stages of the counter being arranged to produce a signal for identifying the cycle, where m is an integer determined from the width of the parallel stream where the width is $2^m$ wide, and the m most significant bits of the means for counting identify that bit of parallel stream in said cycle with which the trigger pulse is to be associated.

2. Apparatus according to claim 1 wherein the cycle sensing means operates by sensing a sequence of bits.

3. Apparatus according to claim 1 further comprising:

means for combining the cycle identifying signal and the bit identifying signals to generate the trigger signal.

4. Apparatus according to claim 2 further comprising:

a multiplexer for selecting a stream from the parallel streams;

logic means for detecting a preselected sequence of bits in the selected stream and arranged to generate a signal when the sequence is detected, the signal identifying the parallel stream cycle;

counting means for controlling the multiplexer, the count of the counting means changing in response to each signal from the logic means, and the count of the counting means identifying that bit parallel stream in said cycle with which the trigger pulse is to be associated.

5. Apparatus according to claim 4 wherein the stream is a PRBS (Pseudo Random Binary Sequences) stream.

6. Apparatus according to claim 3 wherein the combining means comprises a comparator arranged to be enabled by the cycle identifying signal, the comparator being arranged to compare the bit identifying signal with the output from a multiplexer control circuit.

7. Apparatus according to claim 5 further comprising:

means for combining the cycle indentifying signal and the bit identifying signals to generate the trigger signal.

8. Apparatus according to claim 3 wherein combining means comprises an m to $2^m$ decoder arranged to be enabled by the cycle identifying signal, and to receive the bit identifying signals at its selection inputs.

9. Apparatus according to claim 6 further comprising a multiplexer for serializing the outputs of the decoder.

* * * * *